(12) United States Patent
Girardie

(10) Patent No.: US 6,713,199 B2
(45) Date of Patent: Mar. 30, 2004

(54) MULTILAYER STRUCTURE USED ESPECIALLY AS A MATERIAL OF HIGH RELATIVE PERMITTIVITY

(75) Inventor: Lionel Girardie, Eybens (FR)

(73) Assignee: Memscap, Bernin (FR)

( * ) Notice: Subject to any disclaimer, the term of this patent is extended or adjusted under 35 U.S.C. 154(b) by 0 days.

(21) Appl. No.: 10/329,115

(22) Filed: Dec. 24, 2002

(65) Prior Publication Data

US 2003/0124394 A1 Jul. 3, 2003

(30) Foreign Application Priority Data

| Dec. 31, 2001 | (FR) | 01 17069 |
| Feb. 11, 2002 | (FR) | 02 01618 |
| Feb. 27, 2002 | (FR) | 02 02461 |
| Mar. 20, 2002 | (FR) | 02 03445 |
| Mar. 20, 2002 | (FR) | 02 03444 |
| Mar. 20, 2002 | (FR) | 02 03442 |
| Apr. 17, 2002 | (FR) | 02 04782 |
| Jul. 25, 2002 | (FR) | 02 09458 |

(51) Int. Cl.$^7$ .............................................. B32B 18/00
(52) U.S. Cl. ................. 428/701; 428/702; 428/697; 428/699; 428/469; 428/472.1; 428/472.2; 428/336
(58) Field of Search ................ 428/697, 699, 428/701, 702, 469, 472.1, 472.2, 688, 689, 332, 336

(56) References Cited

U.S. PATENT DOCUMENTS

| 4,486,487 | A | | 12/1984 | Skarp |
| 4,790,920 | A | * | 12/1988 | Krzanich |
| 5,417,831 | A | * | 5/1995 | Koch et al. |
| 6,107,656 | A | * | 8/2000 | Igarashi |
| 6,441,417 | B1 | * | 8/2002 | Zhang et al. |

FOREIGN PATENT DOCUMENTS

| FR | 2526622 | | 11/1983 |
| JP | 59222570 | * | 5/1985 |

* cited by examiner

*Primary Examiner*—Deborah Jones
*Assistant Examiner*—Jennifer McNeil
(74) *Attorney, Agent, or Firm*—Heslin Rothenberg Farley & Mesiti P.C.

(57) ABSTRACT

A multilayer structure, used especially as a material of high relative permittivity, includes a plurality of separate layers, each having a thickness of less than 500 Å, and based on hafnium dioxide ($HfD_2$), zirconium dioxide ($ZrO_2$) and alumina ($Al_2O_3$). In practice, the hafnium dioxide, zirconium dioxide and alumina layers form alloys of formula $Hf_xZrAl_yO_z$. Advantageously, the stoichiometry of the $Hf_xZrAl_yO_z$ alloys varies from one layer to another.

9 Claims, No Drawings

MULTILAYER STRUCTURE USED ESPECIALLY AS A MATERIAL OF HIGH RELATIVE PERMITTIVITY

CROSS REFERENCE TO RELATED APPLICATIONS

This application claims priority from the French patent applications 01.17069, filed on Dec. 31, 2001; 02 01618, filed on Feb. 11, 2002; 02 02461, filed Feb. 27, 2002; 02 03442, filed Mar. 20, 2002; 02 03445, filed Mar. 20, 2002; 02 03444, filed Mar. 20, 2002; 02 04782, filed Apr. 17, 2002; and 02 09458, filed Jul. 25, 2002, the entire disclosures of which are incorporated herein by reference. This application is related to commonly assigned, concurrently filed U.S. applications Ser. No. 10/328,880 and Ser. No. 10/328,881.

TECHNICAL FIELD

The invention relates to the field of microelectronics. It relates more specifically to a multilayer structure which can be used especially as a material of high relative permittivity. Such a material may be used to form the insulating layer of a capacitor. Such a capacitor may especially be used as a decoupling capacitor or as a filter capacitor integrated into radiofrequency circuits or the like.

This type of insulating material can also be used to be included in capacitive structures such as those forming the cells of embedded memories (embedded DRAMs). Such cells may be produced within an integrated circuit itself.

The invention also makes it possible to produce oxide gate multilayers (or gate stacks) that are found in transistors of a particular structure, also known by the name gate structure.

PRIOR ART

In general, one of the generally desirable objectives for producing capacitive structures, whether they be capacitors or memory cells, is to increase the capacitance of the structure, that is to say the value of the capacitance per unit area, so as to minimize the size of the components.

This objective of seeking a higher capacitance is achieved especially by the use of dielectrics having as high a relative permittivity as possible.

The value of the capacitance also depends inversely on the distance separating the two electrodes of the structure. This is why it is generally sought to reduce the thickness of the layer of dielectric separating the two electrodes of a capacitive structure.

However, reducing this thickness poses certain physical problems that depend on the materials used. This is because when the dielectric layers are very thin, certain tunnel effect phenomena may arise that modify the behaviour of the capacitive structure, degrading the properties thereof.

Moreover, when a dielectric layer is subjected to too high a voltage, electrical breakdown phenomena may also arise. It is therefore possible to define, for each material, a maximum breakdown electric field above which it cannot be employed.

For example, certain materials are limited to voltages of the order of a few volts, whereas there is a need for capacitors, especially those used for decoupling operations, to be able to withstand voltages greater than 10 volts or so.

Furthermore, the level of leakage current is also a parameter that may be critical in some applications. Mention may especially be made of capacitors operating at high frequency, for which it is important for the behaviour of the capacitor to be maintained over the broadest possible frequency band. The level of leakage current is also critical for applications requiring a high degree of autonomy, when the capacitors are especially embedded in cordless appliances.

However, the level of leakage current depends especially on the crystalline structure of the dielectric.

Document FR 2 526 622 has proposed producing multilayer structures by combining titanium dioxide ($TiO_2$) and alumina ($Al_2O_3$) elementary layers so as to obtain materials having a relatively high permittivity.

This type of structure has the drawback that titanium dioxide ($TiO_2$) is a material having a low density and a permittivity that depends on the crystalline phase. It therefore means that it has to be coupled with a material having an amorphous phase, including up to a temperature of 800° C., and having a high breakdown field. This is why, to avoid increasing the leakage current, that document proposes the superposition of $TiO_2$ and $Al_2O_3$ layers. The electrical performance characteristics of the material are used for TFT (thin film transistor) applications but are insufficient for capacitor cell decoupling applications. This is because, for some applications, the leakage currents are the determining factors for radiofrequency (RF) operation and especially for the generations of devices based on HBT-CMOS and HBT-BICMOS technology that are used in cordless communications appliances, and especially the future generations of mobile telephones known as UMTS. For the latter application, the standard on decoupling is such that it requires leakage currents of less than $10^{-9}$ A/cm$^2$ to be achieved at supply voltages of 5.5 V, by having a breakdown field of greater than 6 MV/cm. In order for such a dielectric to be able to be used in this application, it must possess a band gap energy of greater than 5.5 eV. However the $TiO_2$ and $Al_2O_3$ multilayer stack has only a band gap energy of 4 eV, a breakdown field of about 3.5 MV/cm and leakage currents close to $10^{-6}$ A/cm$^2$. It is very clearly apparent that the material described in that document, developed for TFT applications, cannot also be used for applications involving RF decoupling capacitors and capacitor cells incorporated into integrated circuits in HBT-CMOS and HBT-BICMOS technology.

It is one of the objectives of the invention to provide a material that can be used within various capacitive structures, which combines both a high relative permittivity value, with a high voltage withstand, and a low level of leakage current.

SUMMARY OF THE INVENTION

The invention therefore relates to a multilayer structure that can be used especially as a material of high relative permittivity.

According to the invention, this structure is characterized in that it comprises a plurality of separate layers, each having a thickness of less than 500 ångströms (Å). Some of these layers are based on hafnium dioxide ($HfO_2$), zirconium dioxide ($ZrO_2$) and alumina ($Al_2O_3$). In practice, the hafnium dioxide and alumina layers advantageously form alloys of formula $Hf_xZr_tAl_yO_z$. Advantageously, the stoichiometry of the $Hf_xZr_tAl_yO_z$ alloys varies from one layer to another.

In other words, the material obtained according to the invention is in the form of an alternation of films having differing compositions and stoichiometries, for thicknesses of less than a few hundred ångströms, thus forming a nanolaminated structure. In practice, the thickness of the layers may preferably be less than 200 Å, or even less than 100 Å, or indeed less than 50 Å. In practice, the structure may comprise at least five layers.

Surprisingly, it has been found that hafnium dioxide-zirconium dioxide-alumina alloys have properties which are similar to the most favourable properties of each of the components of the alloy.

Thus, hafnium dioxide is known to be a material of polycrystalline structure. This crystalline structure results in hafnium dioxide being the site of relatively high leakage currents, although this material is very insensitive to avalanche phenomena.

However, the leakage currents of hafnium dioxide are limited because of its atomic composition and its low oxygen vacancy density. Hafnium oxide is also resistant to interfacial impurity diffusion and intermixing, especially because of its high density, namely 9.68 g/cm$^2$. The mechanism for these leakage currents is based on tunnel effects.

Hafnium dioxide is also known for its somewhat high relative permittivity, of around 20, when this material is deposited by ALD (Atomic Layer Deposition) at a temperature below 350° C.

With regard to the voltage withstand, hafnium dioxide has a band gap energy of 5.68 eV for a breakdown field of 4 MV/cm.

As regards the uniformity of the relative permittivity, the current-voltage plot exhibits hysteresis. In accordance with the invention, this hysteresis is markedly reduced thanks to the superposition of layers of alkaline-earth oxide alloys, the mixity of the atoms of which contributes to disorder and to higher integrity of the material. Moreover, the hysteresis is reduced by the use of precursors whose ligands of each molecule released desorb fewer impurities of the carbon, chlorine, hydrogen and nitrogen type. This is because such impurities are generally based on radicals and cause behavioural modifications according to the polarization states. This means that, for a slight variation in voltage applied to the material, the latter does not have exactly the same permittivity properties, which may introduce defects in the electrical behaviour of the capacitor, especially when it is subjected to voltage jumps.

The dielectric forming the subject of the present invention has, for a thickness of less than 50 Å, an equivalent SiO$_2$ thickness or EOT (Equivalent Oxide Thickness) of 9.9 ångströms. This value is particularly close to the 10 ångström thickness characteristic of the gate oxide of a field-effect transistor with a gate 70 nanometers in width. In other words, the dielectric of the invention is particularly well suited for producing the gate oxides of such transistors. This EOT value results from the mixing of the atomic layers of alkaline-earth oxides based on hafnium, zirconium and aluminium and by the molecules at the particular ligands, the thermolysis and chemisorption reactions of which take place within a 250° C. to 325° C. temperature range, and preferably between 280° C. and 290° C. This narrow difference prevents the migration of impurities and the formation of phases because of the entropic behaviour of the layers deposited by the ALD technique.

Moreover, zirconium dioxide is also known to be a material of polycrystalline structure. Zirconium dioxide is the site of relatively high leakage currents, even higher than those of hafnium dioxide, on account of the fact that zirconium dioxide has a relatively large number of oxygen vacancies.

As regards the voltage withstand, zirconium dioxide has a relatively high band gap energy, namely of 7.8 eV, and has a relatively low breakdown field of around 2.2 MV/cm. The relative permittivity of zirconium dioxide is relatively high, around 22.

As regards the other component of the alloy, namely alumina, this is known to possess an amorphous crystalline structure, favourable to low leakage currents, which follow the Poole-Frenkel mechanism.

Alumina has a relative permittivity of 8.4, which value is less than that of hafnium and zirconium dioxides.

On the other hand, alumina has a band gap energy of 8.7 eV and a breakdown field of 7 MV/cm, which values are greater than the abovementioned values of hafnium and zirconium dioxides.

Now, it has surprisingly been found that Hf$_x$Zr$_t$Al$_y$O$_z$ alloys formed by these three materials have particularly beneficial properties especially as regards relative permittivity, which is around 14 to 20 at the deposition temperature, and which may reach between 21 and 33 depending on the subsequent annealing steps at temperatures varying between 450° C. and 850° C. The voltage withstand is also advantageous, since the overall breakdown field is around 8.9 MV/cm.

Moreover, the alloys based on HfO$_2$, ZrO$_2$ and Al$_2$O$_3$ make it possible to stop hafnium and zirconium dioxide grain growth by the amorphous alumina phases. What is therefore obtained is a result that is characterized by a reduction in leakage currents, whereas a priori the two materials taken separately do not have a common mechanism as regards leakage currents.

The Hf$_x$Zr$_t$Al$_y$O$_z$ alloys formed and deposited by ALD have advantages over a nanolaminated structure that would be composed of a stack of successive HfO$_2$, ZrO$_2$ and Al$_2$O$_3$ layers. These advantages are intimately connected with the structure of the grains of the alloy, with its density and with the enthalpy of formation, which give leakage currents of the order of 10$^{-7}$ A/cm$^2$ at 6 V for a thickness of the order of a hundred ångströms. Furthermore, the relative permittivity is higher and the electron transition (or barrier) energy with respect to a metal is greater than 3.4 eV. The band gap of the Hf$_x$Zr$_t$Al$_y$O$_z$ alloy is greater than 7.6 eV, while the nanolaminated structure composed of separate HfO$_2$, ZrO$_2$ and Al$_2$O$_3$ layers has a band gap energy of 5.7 eV.

Moreover, the high cohesion of the crystals and the low oxygen vacancy density lead to good uniformity of the relative permittivity of the characteristic alloys when these are deposited by the ALD technique. The observed leakage currents are typically of the order of 1 nanoamp per cm$^2$ under a voltage of 6 volts, and for a film thickness of less than 10 nanometers.

In one particular embodiment, the multilayer structure of the invention may include external layers that are made only of alumina since, in this case, it is observed that alumina, Al$_2$O$_3$, has a high breakdown value and a relatively high band gap energy compared with the principal metals, especially tungsten, widely used to form electrodes of capacitive structures. The transition voltage threshold between alumina and tungsten is about 3.4 volts, which makes alumina particularly advantageous at the interface with metal, especially tungsten, electrodes.

ILLUSTRATIVE EXAMPLES

The various nanolaminated structures described below were produced using ALD techniques, by depositing the various components of the alloy simultaneously at a temperature of between 320 and 350° C.

By using this technique, it is possible to control the thickness of each of the layers and thus to guarantee good homogeneity of this layer over the entire surface of the elementary layer, and therefore to avoid sources of defects.

The ALD technique may use several sources of materials, namely solid, liquid or gaseous sources, which makes this technique very flexible and versatile. Moreover, it uses precursors which are the vectors of the chemical surface reaction and which transport material to be deposited. More specifically, this transport involves a process of chemisorption of the precursors on the surface to be covered, creating a chemical reaction with ligand exchange between the surface atoms and the precursor molecules.

The principle of this technique avoids the adsorption or condensation of the precursors, and therefore their decomposition. The nucleation sites are continually created until saturation of each phase of the reaction, between which a purge with an inert gas allows the process to be repeated. Deposition uniformity is ensured by the reaction mechanism and not by the reactants used, as is the case in CVD (Chemical Vapour Deposition) techniques since the thickness of the layers deposited by ALD depends on each precursor chemisorption cycle.

For this technique, it will be preferred to use, as precursors, chlorides and oxychlorides such as $HfCl_4$ and $ZrCl_4$ under an atmosphere of trimethyl ammonium (TMA) and ozone or $H_2O$, metallocenes, metal acyls, such as $Al(CH_3)_3$, beta-diketonates, or alkoxides.

Among the various examples produced, the following should be noted:

Example A

| No. of the layer | Formula of the layer | Thickness of the layer |
|---|---|---|
| 1 | $HfZrAl_6O_{13}$ | 10 ångströms |
| 2 | $Hf_2ZrAl_2O_9$ | 20 ångströms |
| 3 | $HfZrAl_4O_{10}$ | 12 ångströms |
| 4 | $HfZr_2AlO_{7.5}$ | 25 ångströms |
| 5 | $HfZrAl_3O_{8.5}$ | 12 ångströms |
| 6 | $Hf_2ZrAlO_{7.5}$ | 25 ångströms |
| 7 | $HfZrAl_2O_7$ | 12 ångströms |
| 8 | $HfZr_2Al_2O_9$ | 20 ångströms |
| 9 | $Hf_2ZrAlO_{7.5}$ | 15 ångströms |
| 10 | $HfZrAl_6O_{13}$ | 10 ångströms |

This nanolaminated structure has a relative permittivity of around 19, a breakdown field of 8.5 MV/cm, a band gap energy of 7.8 eV and an electron transition energy relative to tungsten nitride (WN) of 3.9 eV.

Example B

| No. of the layer | Formula of the layer | Thickness of the layer |
|---|---|---|
| 1 | $Al_2O_3$ | 10 ångströms |
| 2 | $Hf_2ZrAl_2O_9$ | 15 ångströms |
| 3 | $HfZrAl_4O_{10}$ | 12 ångströms |
| 4 | $Hf_2ZrAlO_{7.5}$ | 25 ångströms |
| 5 | $HfZrAl_3O_{8.5}$ | 12 ångströms |
| 6 | $HfZr_2AlO_{7.5}$ | 25 ångströms |
| 7 | $HfZrAl_2O_7$ | 12 ångströms |
| 8 | $HfZrAlO_{7.5}$ | 20 ångströms |
| 9 | $HfZr_2Al_2O_9$ | 15 ångströms |
| 10 | $Al_2O_3$ | 10 ångströms |

This nanolaminated structure has a relative permittivity of around 16 and a breakdown field of 8.5 MV/cm.

Of course, the scope of the invention is not limited by the stoichometric values given for these various examples, rather the invention also covers many other variants provided that they respect the principle of the invention, namely a variation in the stoichiometry between the various components of the alloy from one layer to another.

What is claimed is:

1. A multilayer structure for use, as a material of high relative permittivity, comprising a plurality of separate layers, each having a thickness of less than 500 Å, and at least one of which is based on hafnium dioxide ($HfO_2$), zirconium dioxide ($ZrO_2$) and alumina ($Al_2O_3$).

2. Multilayer structure according to claim 1, wherein the layers based on hafnium dioxide ($HfO_2$), zirconium dioxide ($ZrO_2$) and alumina ($Al_2O_3$) are formed from alloys of formula $Hf_xZr_tAl_yO_z$.

3. Multilayer structure according to claim 2, wherein stoichiometries of the alloys of formula $Hf_xZr_tAl_yO_z$ vary from one layer to another.

4. Multilayer structure according to claim 1, wherein thickness of each layer is between 1 and 200 Å.

5. Multilayer structure according to claim 1, wherein said plurality of separate layers comprises at least five layers.

6. Multilayer structure according to claim 1, wherein at least one external layer of said plurality of layers is made of alumina ($Al_2O_3$).

7. Multilayer structure according to claim 1, wherein each layer is deposited by technique of atomic layer deposition (ALD).

8. Multilayer structure according to claim 1, wherein the thickness of each layer is between 1 and 100 Å.

9. Multilayer structure according to claim 1, wherein the thickness of each layer is between 1 and 50 Å.

* * * * *

UNITED STATES PATENT AND TRADEMARK OFFICE
CERTIFICATE OF CORRECTION

PATENT NO. : 6,713,199 B2
DATED : March 30, 2004
INVENTOR(S) : Girardie

It is certified that error appears in the above-identified patent and that said Letters Patent is hereby corrected as shown below:

<u>Title page,</u>
Item [57], ABSTRACT,
Line 4, delete "(HfD$_2$)" and insert -- (HfO$_2$) --

Signed and Sealed this

Sixth Day of July, 2004

JON W. DUDAS
*Acting Director of the United States Patent and Trademark Office*